United States Patent [19]

Chen

[11] Patent Number: 4,786,609
[45] Date of Patent: Nov. 22, 1988

[54] METHOD OF FABRICATING FIELD-EFFECT TRANSISTOR UTILIZING IMPROVED GATE SIDEWALL SPACERS

[75] Inventor: Teh-Yi J. Chen, Santa Clara, Calif.

[73] Assignee: North American Philips Corporation, Signetics Division, Sunnyvale, Calif.

[21] Appl. No.: 104,187

[22] Filed: Oct. 5, 1987

[51] Int. Cl.⁴ .......................................... H01L 21/265
[52] U.S. Cl. ...................... 437/30; 437/29; 437/44; 437/41; 437/228; 437/241; 437/238; 156/653; 357/23
[58] Field of Search ............ 357/23.3, 23.9, 23.11, 357/23.8; 156/643, 653, 657; 437/29, 30, 41, 44, 45, 228, 238, 239, 241

[56] References Cited

U.S. PATENT DOCUMENTS

| | | |
|---|---|---|
| 4,419,809 | 12/1983 | Riseman et al. |
| 4,419,810 | 12/1983 | Riseman ............................ 437/46 |
| 4,420,872 | 12/1983 | Soladezaldivar. |
| 4,486,943 | 12/1984 | Ryden et al. |
| 4,503,601 | 5/1985 | Chiao ............................... 437/44 |
| 4,701,423 | 10/1987 | Szluk ............................... 437/57 |
| 4,703,551 | 11/1987 | Szluk et al. ....................... 437/57 |
| 4,737,472 | 4/1988 | Schaber et al. ............ 148/DIG. 124 |

FOREIGN PATENT DOCUMENTS

| | | |
|---|---|---|
| 51534 | 5/1982 | European Pat. Off. |
| 90318 | 10/1983 | European Pat. Off. |
| 168324 | | European Pat. Off. |
| 214472 | 8/1986 | Japan. |
| 212067 | 9/1986 | Japan. |
| 118578 | 5/1987 | Japan. |
| 173763 | 7/1987 | Japan. |
| 2123605 | 2/1984 | United Kingdom. |

OTHER PUBLICATIONS

Ogura et al, "Elimination of Hot Electron...", IEDM Tech. Dig., 1981, pp. 651–654.
"Single Device DRAM...", IBM TDB, May 1985, pp. 7270–7271.
Shibata et al, "An Optimally Designed...", IEEE IEDM Tech. Dig., 1981, pp. 647–650.

Primary Examiner—Brian E. Hearn
Assistant Examiner—Kevin McAndrews
Attorney, Agent, or Firm—R. Meetin; D. Treacy; T. Briody

[57] ABSTRACT

Gate sidewall spacers are created by a two-step procedure in fabricating a field-effect transistor using a protective material such as silicon nitride to prevent gate-electrode oxidation. In the first step, a layer (32) of insulating material is conformally deposited and then substantially removed except for small spacer portions (34) adjoining the sidewalls of a doped non-monocrystalline semiconductor layer (20A) destined to become the gate electrode (36). The second step consists of performing an oxidizing heat treatment to increase the thickness of the spacer portions. No significant gate dielectric encroachment occurs. Also, the spacers achieve a profile that substantially avoids electrical shorts.

15 Claims, 3 Drawing Sheets

METHOD OF FABRICATING FIELD-EFFECT TRANSISTOR UTILIZING IMPROVED GATE SIDEWALL SPACERS

FIELD OF USE

This invention relates to methods for manufacturing semiconductor devices that employ electrically insulating sidewall spacers to control device characteristics.

BACKGROUND ART

An insulated-gate field-effect transistor (FET) made from a body of monocrystalline silicon according to state-of-the-art semiconductor processing techniques usually consists of a conductively doped polycrystalline silicon (polysilicon) gate electrode, a thin gate dielectric lying under the gate electrode, and a pair of source/drain (S/D) regions formed in the semiconductor body. The S/D regions are separated from each other by a channel region that lies below the gate dielectric.

The S/D regions are typically created by ion implantation in which the gate electrode is used as a shield to prevent implantation into the channel. At the end of the implantation, the sides of the gate electrode are in substantial vertical alignment with the inside boundaries of the S/D regions. However, lateral diffusion of the implanted dopant during subsequent heating steps causes the gate electrode to partially overlap the S/D regions in the final FET. The overlap causes a loss in effective channel length and a loss in FET speed.

One technique for controlling the vertical alignment is to form insulating spacers along the sidewalls of the gate electrode before performing the ion implantation to define the S/D regions. The sidewall spacers then act as a further implantation shield during the S/D implantation. This increases the initial lateral separation between the S/D regions, thereby substantially reducing undesirable overlap of the gate electrode to the S/D regions.

In U.S. Pat. No. 4,420,872, Solo (de Zaldivar) creates sidewall spacers by thermally oxidizing side portions of a patterned polysilicon layer formed on the gate dielectric. The oxidation is done at 1050° C. A layer of silicon nitride lying on the polysilicon layer largely prevents the underlying polysilicon at the intended location for the gate electrode from being oxidized.

Later in the fabrication process, Solo etches contact openings through silicon dioxide along the upper surfaces of the S/D regions. The spacers and nitride layer protect the gate electrode. Although Solo actually performs the etch using a photoresist mask, the S/D contact openings are self-aligned in that the boundaries of the openings nearest the gate electrode are determined by the spacers rather than the photoresist pattern. The self-alignment leads to a relatively compact FET.

A disadvantage of Solo is that some of the polysilicon that forms the bottom surface of the gate electrode near its sidewalls is oxidized during spacer formation. This phenomenon is termed "gate dielectric encroachment" because the thickness of the gate dielectric becomes significantly greater at the sides than in the middle. The encroachment reduces the effective area of the gate electrode. Also, the S/D regions must be driven laterally in further below the gate dielectric. This usually leads to a performance degradation because the S/D regions go deeper into the semiconductor body at the same time.

Gate dielectric encroachment is substantially avoided when the sidewall spacers are formed by a combination of oxide deposition and anisotropic etching. Ogura et al, "Elimination of Hot Electron Gate Current by the Lightly Doped Drain-Source Structure," *IEEE IEDM Tech. Dig.*, 7–9 Dec. 1981, pp. 651–654, employ this process in fabricating a so-called lightly doped drain (LDD) FET. In material part, Ogura et al start by forming a structure in which a patterned cover layer of silicon dioxide lies on a similarly patterned doped polysilicon layer (destined to become the gate electrode). The polysilicon layer lies on a dielectric layer located along the upper surface of a P-type region of a monocrystalline silicon body. Using the two patterned layers as an implantation shield, the LDD part of the FET is created by implanting an N-type dopant at a low dosage into the P-type region.

A layer of silicon dioxide is then deposited conformally on the upper surface of the structure. Using an anisotropic etchant, largely all of the conformal layer is removed except for small spacer portions that adjoin the sidewalls of the polysilicon layer. Due to the nature of the etching process, each of the sidewall spacers is thicker at the bottom than at the top.

The main portions of the S/D regions are formed by implanting an N-type dopant into the P-type region using the spacer portions and the patterned layers as an implantation mask. An annealing heat treatment is then performed to repair lattice damage and activate the implanted species. Parts of the polysilicon layer and the P-type region are oxidized along their upper surface during the heat treatment. The remaining polysilicon forms the gate electrode.

Because the same material—i.e., silicon dioxide—lies on both the gate electrode and the S/D regions in Ogura et al, it is extremely difficult to etch self-aligned contact openings down to the S/D regions without exposing the gate electrode at the same time. A critical photoresist mask must be utilized to define the S/D contact openings. This increases the FET die area.

GENERAL DISCLOSURE OF THE INVENTION

The present invention is a semiconductor manufacturing process in which gate sidewall spacers for an insulated-gate field-effect transistor formed from a monocrystalline semiconductor body are created in such a way that there is no significant gate dielectric encroachment. Contact openings for the S/D regions of the FET can be etched down to the semiconductor body in a self-aligned manner using the spacers and the material between them as an etch barrier. The resulting FET occupies a small die area and performs very well. The invention thereby achieves the advantages of Solo and Ogura et al while avoiding their disadvantages.

More particularly, a structure is first formed in which a dielectric layer lies along the upper surface of a major doped region of a semiconductor body. A patterned insulating cover layer overlies a similarly patterned doped layer of non-monocrystalline semiconductor material lying on the dielectric layer. The cover layer comprises a protective material, such as silicon nitride, capable of acting as a thermal oxidation shield for the doped non-monocrystalline layer. If a lightly doped drain architecture is desired, a preliminary semiconductor dopant is implanted at a low dosage into selected parts of the major region using the patterned layers as an implantation mask.

The processing sequence continues with the deposition of a further layer of insulating material on the upper surface of the structure. Largely all of the further layer is removed except for small spacer portions adjoining the sidewalls of the doped non-monocrystalline layer. The thickness of the sidewall spacer portions is now increased by performing a heat treatment to oxidize portions of the doped layer along its sidewalls. The oxidizing temperature is preferably 700°-850° C. Parts of the major region along its upper surface are also oxidized during the heat treatment. The cover layer substantially prevents the underlying non-monocrystalline material of the doped layer, except for the non-monocrystalline material along its sidewalls, from being oxidized. The remainder of the doped layer forms the gate electrode.

Next, a main semiconductor dopant is implanted into selected parts of the major region to define the main S/D regions. The spacer portions and the (remaining) material of the patterned layers block implantation into the part of the major region below the spacers and patterned layers.

In a principal variation, the heat treatment and main dopant implantation are performed in the reverse order from that given in the previous two paragraphs. The main S/D regions are then slightly closer to each other. While this may sometimes be undesirable, the variation achieves all the other advantages of the basic invention.

In subsequent fabrication steps, self-aligned contact openings to the main S/D regions are created by etching openings through oxidized material along the upper surface of the major region using the spacers and at least part of the cover layer as an etch barrier to protect the gate electrode. The structure is then provided with a pattern of conductive material that contacts the main S/D regions through the openings. Due to the way in which the sidewall spacers are formed, the likelihood of an electrical short between the gate electrode and the conductive pattern is very small.

BRIEF DESCRIPTION OF THE DRAWINGS

Like reference symbols are employed in the drawings and in the descrption of the preferred embodiments to represent the same or very similar item or items.

DESCRIPTION OF THE PREFERRED EMBODIMENTS

Figure 1A:
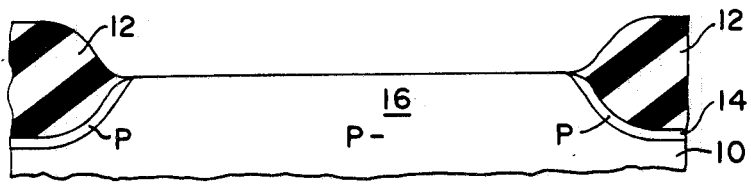
FIGS. 1a, 1b, 1c, 1d, 1e, 1f, 1g, 1h, 1i, and 1j are cross-sectional structural views representing steps in a process for manufacturing a semiconductor device in accordance with the invention.

Referring to the drawings, FIGS. 1a-1j illustrate steps in the fabrication of an N-channel insulated-gate FET that utilizes sidewall spacers made in acordance with the invention. Conventional cleaning and photoresist masking techniques are employed in the fabrication process. References to cleaning steps, to the steps involved in making photoresist masks, and to other such steps that are well known in the semiconductor art are omitted from the following description to simplify the discussion.

The starting point is a (100) monocrystalline silicon semiconductor body having a lightly doped major P-type region 10 as shown in FIG. 1a. A recessed electrically insulating layer 12 of silicon dioxide underlaid by a P-type channel-stop region 14 is formed according to conventional oxide-isolation techniques along the upper surface of P— region 10. Oxide layer 12 laterally separates a group of active semiconductor islands from one another along the upper surface of region 10. One such island 16 appears in FIG. 1a.

A thin dielectric layer 18 (destined to become the FET gate dielectric) is formed along the upper surface of island 16 in P— region 10 to a thickness of 100–500 angstroms. See FIG. 1b. Dielectric layer 18 preferably consists of thermally grown silicon dioxide. However, layer 18 may be formed with other dielectric materials such as silicon nitride or a combination of silicon dioxide and silicon nitride.

Figure 1B:
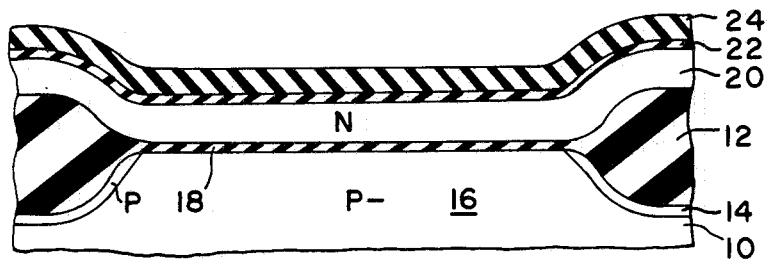

A layer of polysilicon having a thickness of 0.25–0.35 micron is deposited according to conventional low-pressure chemical vapor deposition (LPCVD) techniques on dielectric layer 18 and is then doped either by diffusion or ion implantation to produce an electrically conductive polysilicon layer 20 (destined to become the FET gate electrode). See FIG. 1b again. The dopant in layer 20 may be P-type (boron) or N-type (arsenic or phosphorus). FIG. 1b illustrates the N-type case.

A thin electrically insulating layer 22 of silicon dioxide is thermally grown along, or deposited on, the upper surface of doped polysilicon layer 20. Oxide layer 22 has a thickness of 300–500 angstroms. A relatively thin layer 24 of silicon nitride is now deposited according to conventional LPCVD techniques on oxide layer 22. Nitride layer 24 has a thickness of 600–1,000 angstroms. This completes the structure illustrated in FIG. 1b.

Figure 1C:
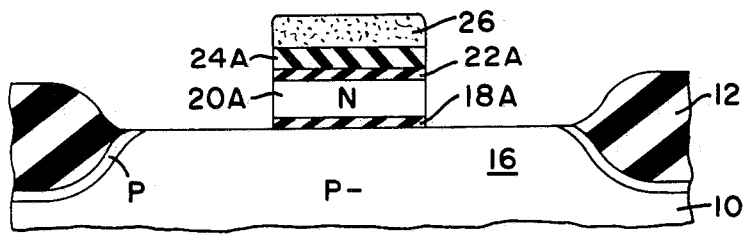
Figure 1D:
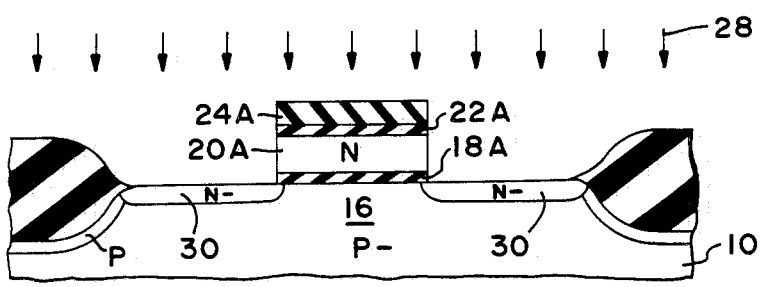

A photoresist mask 26 is formed on nitride layer 24 at the general location for the gate electrode and gate dielectric. Using one or more conventional anisotropic dry etchants, the exposed portions of layers 24, 22, 20, and 18 are removed in sequence. FIG. 1c shows the resulting structure in which patterned layers 18A, 20A, 22A, and 24A are the respective remainders of layers 18–24. Oxide layer 18 could also be left intact.

After removing mask 26, ions 28 of a suitable N-type dopant are implanted into P— region 10 at a low dosage and a low energy to produce lightly doped N-type S/D regions 30 for an LDD architecture. See FIG. 1d. The LDD dopant is preferably phosphorus implanted at a dose of $1 \times 10^{13}$ ions/cm$^2$ and an energy of 50 keV. Arsenic could also be used as the dopant. Layers 18A–24A act as a shield that substantially blocks ions of the LDD dopant from being implanted into the part of region 10 underlying layers 20A–24A.

Figure 1E:
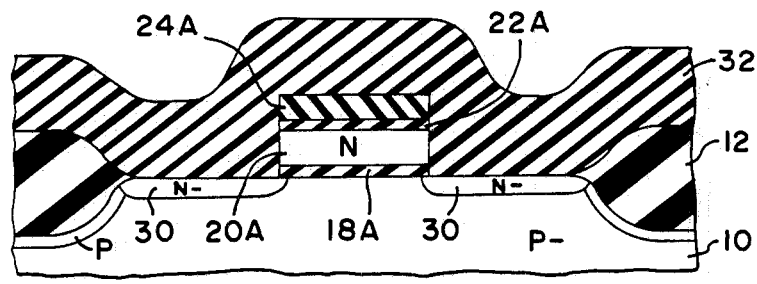
Figure 1F:
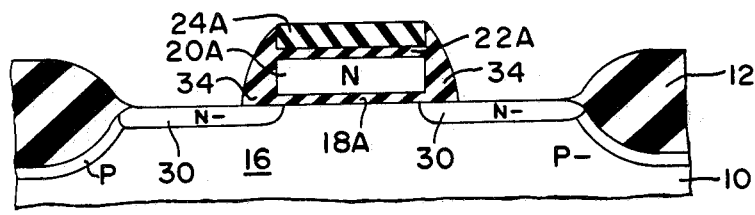

A further layer 32 of silicon dioxide is conformally deposited according to a conventional LPCVD technique on the upper surface of the structure as depicted in FIG. 1e. The deposition temperature is typically 420° C. Oxide layer 32 has a thickness approximately equal to the total thickness of layers 18A–24A. For example, the thickness of layer 32 is approximately 0.3 micron.

An anisotropic etch is performed to remove largely all of oxide layer 32 except for small spacer portions 34 that adjoin the sidewalls of layers 18A–24A. See FIG. 1f. The etch is typically done according to reactive ion etch (RIE) techniques using a combination of CHF$_3$, CO$_2$, and He as the etchant. Due to the nature of the etch and the original shape of oxide layer 32, the spacer thickness—i.e., the lateral spacer dimension in the drawings—gradually increases in going from top to bottom. The spacer thickness is typically 0.25 micron at the upper surface of island 16.

Portions of the polysilicon that forms the sidewalls of doped layer 20A are thermally oxidized to increase the thickness of oxide spacers 34. This is done by performing a heat treatment on the structure in an oxidizing environment at a temperature no greater than 850° C. The oxidation temperature is at least 700° C. The heat treatment is preferably done for 2 hours in dry oxygen at 800° C.

Figure 1G:
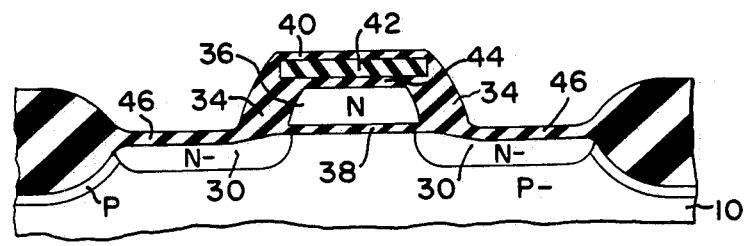
Figure 1H:
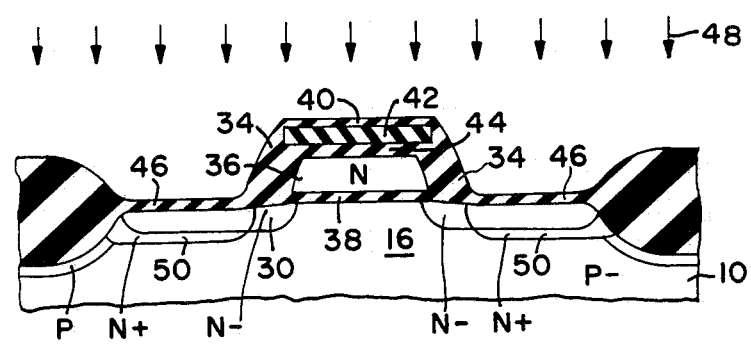

Nitride layer 24A functions as a thermal oxidation shield during the heat treatment to block the oxygen above layer 24A from reaching polysilicon layer 20A. Layer 24A thereby substantially protects the underlying polysilicon, except for the polysilicon along the sidewalls of layer 20A, from being oxidized. FIG. 1g shows the resulting structure in which the remainder 36 of layer 20A forms the gate electrode for the FET.

The portion 38 of oxide layer 18A underlying gate electrode 36 is the gate dielectric for the FET. Due to both the relatively low oxidation temperature and the shielding effect provided by the lower parts of spacers 34, very little polysilicon along the bottom of electrode 36 is oxidized during the heat treatment. The thickness of gate dielectric 38 remains largely constant across its area, as indicated in FIG. 1g. That is, there is little gate dielectric encroachment.

The amount of additional spacer thickness achieved during the heat treatment is greater at the top of each spacer 34 than at the bottom due to the oxidation mechanism and the initial spacer shape. Compare FIGS. 1f and 1g. The thickness of spacers 34 therefore becomes more uniform across their height. This is a highly beneficial result because the spacer thickness at the top corners of electrode 36 is now great enough to avoid electrical shorts that might otherwise occur between electrode 36 and the S/D metalization (described below) during subsequent processing. The minimum spacer thickness at the end of the heat treatment is typically 0.2 micron.

A small thickness of the silicon nitride along the top of layer 24A is converted into a very thin layer 40 of silicon dioxide (typically 20 angstroms in thickness) during the heat treatment. The remainder of nitride layer 24A is labeled as layer 42 in FIG. 1g. The portion of oxide layer 22A above electrode 36 is labeled as layer 44. Also, a small thickness of the exposed silicon along the tops of N− regions 30 is converted into layers 46 of silicon dioxide. The thickness of oxide layers 46 is typically 400 angstroms.

Ions 48 of a suitable N-type dopant are implanted into P− region 16 at a high dosage and a high energy to produce main S/D regions 50. See FIG. 1h. The main S/D dopant is preferably arsenic implanted at $6 \times 10^{15}$ ions/cm$^2$ and 80 keV. Antimony could also be used. Spacers 34 and layers 36–44 act as a shield that substantially blocks ions of the main dopant from being implanted into the part of region 10 below elements 34–44. Oxide layers 46 (along with oxide layer 40 and a small thickness of spacers 34) could be removed before the main S/D implantation.

Figure 1I:
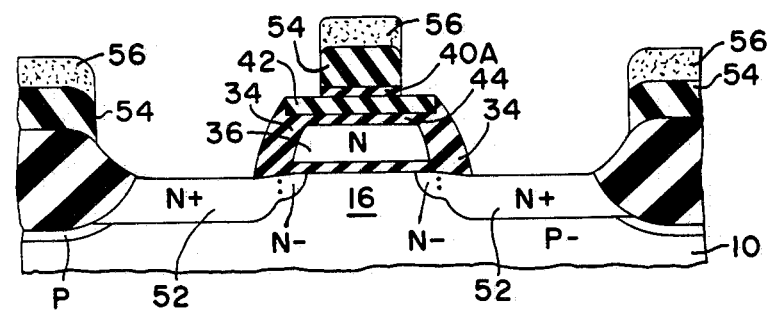

The structure is now annealed to repair lattice damage and activate the implanted N-type dopants. The anneal is preferably done for 1 hour at 920° C. in nitrogen with 10% oxygen. The implanted N-type dopants diffuse outward. Each pair of N-type regions 30 and 50 becomes a composite N-type S/D region 52 having a heavily doped main portion and a lightly doped extension (demarcated by a dotted line) as indicated in FIG. 1i. Polysilicon electrode 36 slightly overlaps the N− extensions in the vertical direction but does not overlap the main N+ portions. This LDD configuration prevents undesired hot carrier generation.

A layer 54 of an electrically insulating material such as phosphosilicate glass, boron-doped phosphosilicate glass, or plasma silicon nitride is typically deposited on the upper surface of the structure at this point. To provide more protection for electrode 36, a thin layer of LPCVD silicon nitride could be formed on the top of the structure before depositing insulation layer 54. In either case, a photoresist mask 56 is formed on layer 54. Mask 56 has apertures generally above, but substantially larger than, oxide layers 46 that overlie the N+ portions of S/D regions 52.

Self-aligned contact openings to the N+ portions of S/D regions 52 are created by etching the structure with a suitable oxide etchant to remove oxide layers 46. See FIG. 1i. Slight thicknesses of the other oxide portions are also removed during this etch. Layer 40A is, for example, the remainder of oxide layer 40. The etch is typically performed with the above-mentioned RIE etchant. Spacers 34 and the exposed parts of nitride layer 42 (in combination with mask 56) function as an etch barrier to prevent any portion of electrode 36 from being exposed during the etch. Mask 56 is subsequently removed.

Insulation layer 54 may not be needed in some applications. In such a case, self-aligned contact openings can be etched down to N+ regions 52 in the manner described above except that a photoresist mask need not be used.

Figure 1J:
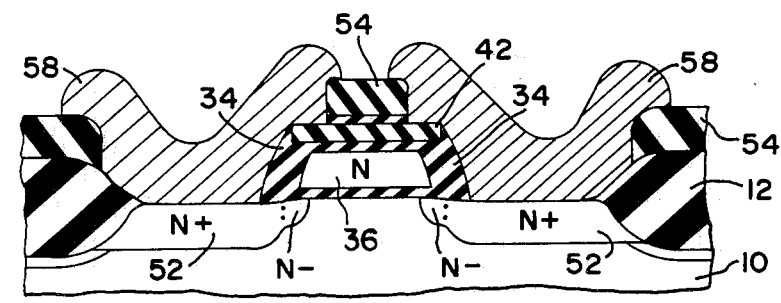

The structure is provided with a metalization pattern 58 that contacts S/D regions 52 through the contact openings as depicted in FIG. 1j. Metalization 58 is typically created by depositing a layer of a suitable metal such as aluminum with 1% silicon and 1% copper and then removing the undesired metal. Prior to metal deposition, the upper surface of the exposed silicon may be supplied with a thin layer of a self-aligned metal silicide (such as titanium silicide) or a thin layer of selectively deposited tungsten. The FET occupies a small area because the metal contacts to regions 52 are self-aligned.

Figure 2A:
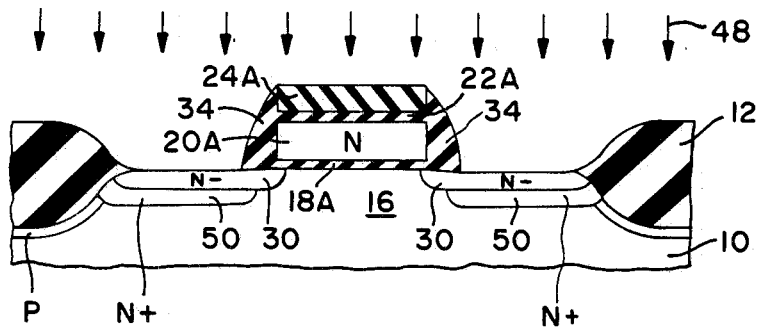
FIGS. 2a and 2b are cross sectional structural views representing alternative steps to those of FIGS. 1g and 1h.
Figure 2B:
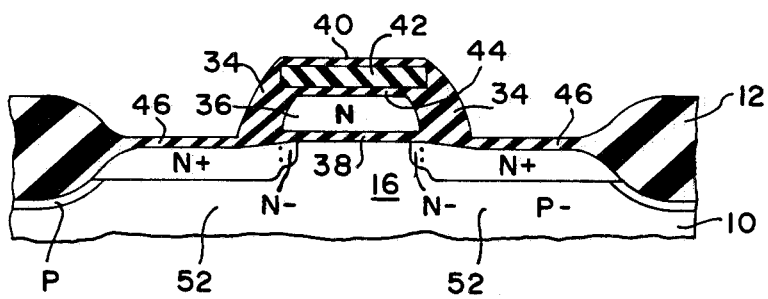

The order for performing the main S/D implantation and the oxidizing (or first) heat treatment to increase the spacer thickness may be reversed from that described above. This alternative is illustrated in FIGS. 2a and 2b. As indicated in FIG. 2a, spacers 34A and patterned layers 18A–24A then act as an implantation mask for the main dopant. Because the spacer thickness has not yet been increased, main S/D regions 50 in FIG. 2a are slightly closer than in FIG. 1h.

The oxidizing heat treatment causes the implanted N-type dopants to diffuse slightly. See FIG. 2b. Aside from these differences, the structure in FIG. 2b is the same as in FIG. 1h.

While the invention has been described with reference to particular embodiments, this description is solely for the purpose of illustration and is not to be construed as limiting the scope of the invention claimed below. For example, the above process could be employed to make a P-channel insulated-gate FET by reversing the conductivities for all of the regions except possibly the conductivity for the gate electrode. The P-channel FET would typically not have an LDD extension. Both types of FET's could be made in the same semiconductor device using the process of the invention.

Rather than starting directly with polysilicon, the gate electrode could be formed by initially depositing another form of non-monocrystalline semiconductor material such as amorphous silicon. During the subsequent high-temperature steps, the amorphous silicon is converted into polysilicon. Thus, various modifications, changes, and applications may be made by those skilled in the art without departing from the true scope and spirit of the invention as defined by the appended claims.

I claim:

1. A method comprising the steps of:
    forming a structure in which a patterned electrically insulating cover layer overlies a similarly patterned conductively doped layer of non-monocrystalline semiconductor material lying on a dielectric layer that lies along the upper surface of a major doped region of a semiconductor body;
    depositing a further layer of electrically insulating material on the upper surface of the structure;
    removing largely all of the further layer except for small spacer portions adjoining the sidewalls of the doped layer; and
    performing an oxidizing heat treatment to oxidize parts of the doped layer and parts of the major region along its upper surface, and implanting a main semiconductor dopant into selected parts of the major region using the spacer portions and the material of the patterned layers to substantially block the main dopant from being implanted into the part of the major region below the spacer portions and the material of the patterned layers; characterized in that the cover layer comprises a protective material that substantially prevents the underlying non-monocrystalline material of the doped layer, except for the non-monocrystalline material along its sidewalls, from being oxidized during the heat treatment, portions of the doped layer along its sidewalls being oxidized during the heat treatment to increase the thickness of the spacer portions.

2. A method as in claim 1 characterized in that the heat treatment is performed before the implantation of the main dopant.

3. A method as in claim 1 characterized in that the heat treatment is performed after the implantation of the main dopant.

4. A method as in claim 2 or 3 characterized in that the heat treatment is performed at a temperature in the range of 700° C.–850° C.

5. A method as in claim 4 wherein the removing step is performed by anisotropically etching the further layer so that the thickness of the spacer portions, as they exist at the end of the removing step, generally increases in going downward, characterized in that the amount of additional thickness achieved for the spacer portions during the heat treatment generally decreases in going downward.

6. A method as in claim 2 or 3 characterized, after the heat treatment and the implantation of the main dopant, by the steps of:
    etching openings through the oxidized material along the upper surface of the major region using the spacer portions and at least part of the cover layer as an etch barrier to prevent the doped layer from being exposed; and
    subsequently providing a pattern of electrically conductive material that contacts the major region through the openings.

7. A method as in claim 6 characterized in that the protective material of the cover layer is silicon nitride.

8. A method as in claim 2 or 3 characterized, between the forming and depositing steps, by the step of implanting a preliminary semiconductor dopant into selected parts of the major region through its upper surface using the patterned layers to substantially block the preliminary dopant from being implanted into the part of the major region below the patterned layers.

9. A method wherein;
    a structure is formed in which a patterned electrically insulating cover layer overlies a similarly patterned conductively doped non-monocrystalline silicon layer lying on an electrically insulating layer that lies along the upper surface of a major region of a first conductivity type of a monocrystalline silicon body;
    a further layer consisting principally of silicon dioxide is deposited on the upper surface of the structure;
    largely all of the further layer is removed except for small spacer portions that adjoin the sidewalls of the doped layer and extend fully across its thickness; and
    an oxidizing heat treatment is performed to oxidize parts of the doped layer and parts of the major region along its upper surface, and ions of a main dopant of a second conductivity type opposite to the first conductivity type are implanted into selected parts of the major region through its upper surface using the spacer portions and the material of the patterned layers as a shield that substantially blocks ions of the main dopant from being implanted into the part of the major region below the spacer portions and the material of the patterned layers; characterized in that the cover layer comprises a protective material that substantially prevents the underlying non-monocrystalline silicon of the doped layer, except for the non-monocrystalline silicon along its sidewalls, from being oxidized during the heat treatment, portions of the doped layer along its sidewalls being oxidized during the heat treatment to increase the thickness of the spacer portions.

10. A method as in claim 9 wherein the first and second conductivity types respectively are P-type and N-type, characterized, between the steps of forming the structure and depositing the further layer, by the step of implanting ions of a preliminary dopant of the second conductivity type into selected parts of the major region through its upper surface using the patterned layers as a shield that substantially blocks ions of the preliminary dopant from being implanted into the part of the major region below the patterned layers.

11. A method as in claim 9 characterized in that the first and second conductivity types respectively are N-type and P-type.

12. A method as in claim 10 or 11 characterized, after the heat treatment and the implantation of the main dopant, by the steps of:
    etching openings through the oxidized material along the upper surface of the major region using the spacer portions and at least part of the cover layer as an etch barrier to prevent the doped layer from being exposed; and subsequently providing a pattern of electrically conductive material that contacts the major region through the openings.

13. A method as in claim 9 characterized in that the protective material of the cover layer is silicon nitride.

14. A method as in claim 13 characterized in that the heat treatment is performed before the implantation of the main dopant.

15. A method as in claim 13 characterized in that the step of forming the structure includes creating the cover layer on a similarly patterned intermediate layer consisting principally of silicon dioxide located along the upper surface of the doped layer.

* * * * *